(12) United States Patent
Li et al.

(10) Patent No.: US 6,524,887 B2
(45) Date of Patent: Feb. 25, 2003

(54) EMBEDDED RECESS IN POLYMER MEMORY PACKAGE AND METHOD OF MAKING SAME

(75) Inventors: Jian Li, Sunnyvale, CA (US); Xiao-Chun Mu, Saratogo, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/909,529

(22) Filed: Jul. 20, 2001

(65) Prior Publication Data

US 2003/0017643 A1 Jan. 23, 2003

(51) Int. Cl.$^7$ ................... H01L 21/44; H01L 21/48; H01L 21/50
(52) U.S. Cl. ........................ 438/106; 438/121
(58) Field of Search ............... 438/106, 110, 438/121, 123, 124, 125, 126, 127, 122

(56) References Cited

U.S. PATENT DOCUMENTS

| | | | | |
|---|---|---|---|---|
| 4,593,456 A | * | 6/1986 | Cheung | |
| 5,843,808 A | * | 12/1998 | Karnezos | |
| 5,939,775 A | * | 8/1999 | Bucci et al. | |
| 6,314,641 B1 | * | 11/2001 | Akram | |
| 6,324,069 B1 | * | 11/2001 | Weber | |

OTHER PUBLICATIONS

Borca, C., et al., "Influence of dynamical scattering in crystalline poly(vinylidene fluoride–trifluoroethylene) copolymers", *Applied Physics Letters,* vol. 74, 347–349, (Jan. 18, 1999).

Borca, C., et al., "Lattice–Stiffening Transition in Copolymer Films of Vinylidene Fluoride (70%) with Trifluoroethylene (30%)", *Physical Review Letters,* 4562–4565, (Nov. 29, 1999).

Bune, A., et al., "Piezoelectric and pyroelectric properties of ferroelectric Langmuir–Blodgett polymer films", *Journal of Applied Physics,* vol. 85, 7869–7873, (Jun. 1, 1999).

Bune, a., et al., "Two–dimensional ferroelectric films", *Nature,* vol. 391, 874–877, (Feb. 26, 1998).

Choi, J., et al., "Phase transition in the surface structure in copolymer films of vinylidene fluoride (70%) with trifluorethylene (30%)", *Physical Review B,* vol. 61, 5760–5770, (Feb. 15, 2000).

Desu, S., "Minimization of Fatigue in Ferroelectric Films", *Phys. Stat. Sol. (a)151,* 467–480, Apr. 1995.

Ducharme, S., et al., "Ultrathin Ferroelectric Polymer Films", *Ferroelectrics,* vol. 202, 29–37, Aug. 1996.

Lovinger, A.J., "Ferroelectric Polymers", *Science,* vol. 220, 1115–1121, (Jun. 10, 1983).

Morikawa, E., et al., "Photoemission study of direct photomicromaching in poly(vinylidene fluoride)", *Journal of Applied Physics,* vol. 87, 4010–4016, (Apr. 15, 2000).

* cited by examiner

*Primary Examiner*—David Nelms
*Assistant Examiner*—Phuc T. Dang
(74) *Attorney, Agent, or Firm*—Blakely, Sokoloff, Taylor & Zafman LLP

(57) ABSTRACT

The invention relates to packaging of a novel ferroelectric polymer memory device. Packaging is configured with a recess geometry into which the ferroelectric polymer memory device extends, that resists contact with the polymer portion of the ferroelectric polymer memory device. In one embodiment, an embedded recess geometry is used that resists thermal and mechanical stresses upon the polymer.

Also disclosed is a method of forming the ferroelectric polymer memory device. The method may be applied to both inorganic and organic substrates.

27 Claims, 4 Drawing Sheets

EMBEDDED RECESS IN POLYMER MEMORY PACKAGE AND METHOD OF MAKING SAME

BACKGROUND OF THE INVENTION

1. Field of the Invention

The present invention relates generally to microelectronic device packaging. More particularly, the present invention relates to packaging of a microelectronic storage device. In particular, the present invention relates to a package for a cross-point ferroelectric polymer memory device and a method of packaging the device.

2. Description of Related Art

In the microelectronics field, continual pressure exists to find faster, denser, and more cost-effective solutions to data storage. Whether the data storage is fast, on-die storage such as static random access memory (SRAM), whether it is the somewhat slower embedded dynamic random access memory (eDRAM), the even slower off-die dynamic random access memory (DRAM), or whether it is magnetic- or magneto optical disks for mass storage, each technology is constantly being advanced to meet the demand for increased speed and capacity, and for lower voltage operation.

It was discovered that some polymers exhibit ferromagnetism. One such polymer is poly vinylidene fluoride (PVDF, whose repeat formula is $(CH_2—CF_2)_n$) and some of its copolymers. One activity involved in operation of a ferroelectric polymer data storage device relates to packaging the ferroelectric polymer device according to unique needs. Conventional compression molding techniques may operate in a temperature range of about 175 C. Such a temperature range may be detrimental to ferroelectric polymers such that process yields are lowered.

BRIEF DESCRIPTION OF THE DRAWINGS

In order that the manner in which the above recited and other advantages of the invention are obtained, a more particular description of the invention briefly described above will be rendered by reference to specific embodiments thereof which are illustrated in the appended drawings. Understanding that these drawings depict only typical embodiments of the invention that are not necessarily drawn to scale and are not therefore to be considered to be limiting of its scope, the invention will be described and explained with additional specificity and detail through the use of the accompanying drawings in which.

DETAILED DESCRIPTION OF THE INVENTION

The present invention relates to a ferroelectric polymer memory package that addresses issues of resisting thermal and mechanical stresses on the polymer memory array. According to an embodiment, an embedded molding core may be used that creates a recess geometry that resists contact between the package and the actual polymer memory array. The present invention overcomes problems that would otherwise be created by using existing packaging technology. According to the present invention, the ferroelectric polymer memory package may include storage that is used for current players that operate at a standard such as Motion Picture Expert Group 3 (MPEG3 or MP3) and the like. Existing MP3 players may use CompactFlash (CF) technology. Because CF slots are designed across numerous platforms, the present invention also relates to a ferroelectric polymer memory device that is part of a system. The system includes a host that receives the ferroelectric polymer memory device in a package according to an embodiment.

When a polymer memory device is made in a multi-layer mode, the structure is relatively soft due the material qualities of the PVDF material. Molding processing could add high pressure to the polymer that could destroy the structure during packaging.

The following description includes terms, such as upper, lower, first, second, etc. that are used for descriptive purposes only and are not to be construed as limiting. The embodiments of an apparatus or article of the present invention described herein can be manufactured, used, or shipped in a number of positions and orientations.

Reference will now be made to the drawings wherein like structures will be provided with like reference designations. In order to show the structures of the present invention most clearly, the drawings included herein are diagrammatic representations of integrated circuit structures. Thus, the actual appearance of the fabricated structures, for example in a photomicrograph, may appear different while still incorporating the essential structures of the present invention. Moreover, the drawings show only the structures necessary to understand the present invention. Additional structures known in the art have not been included to maintain the clarity of the drawings.

Figure 1:
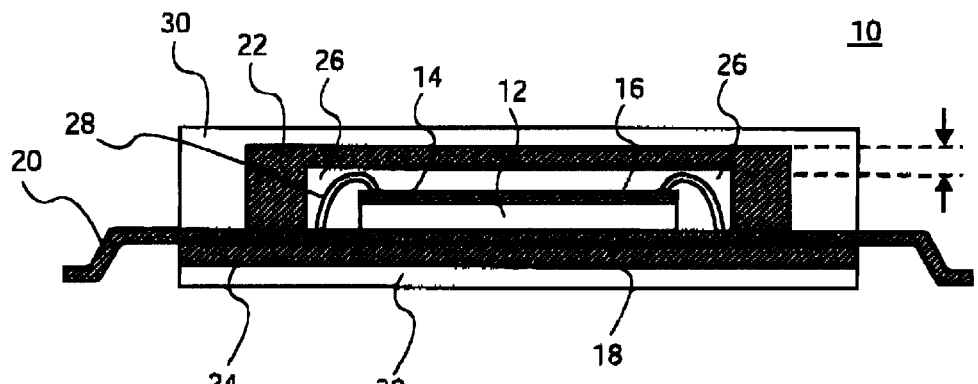
FIG. 1 is an elevational cross-section of a ferroelectric polymer memory device package according to a device-on-chip substrate embodiment.

FIG. 1 is an elevational cross-section of a ferroelectric polymer memory device package according to a device-on-chip substrate embodiment. In FIG. 1, a package 10 is depicted that includes a substrate 12 and a ferroelectric polymer memory device 14 disposed on the substrate 12. In an embodiment, substrate 12 comprises logic-bearing silicon. The logic-bearing silicon may include structures such as n-doped metal oxide silicon (n-MOS), p-doped MOS (p-MOS), complementary MOS (CMOS), bipolar CMOS (BiCMOS) and others. The logic-bearing silicon may also include row and column-addressing communication at the periphery of substrate 12. The substrate may also be a processor that includes row and column addressing communication at the periphery of substrate 12.

Substrate 12 has a first side 16 and a second side 18. Ferroelectric polymer memory device 14 is disposed upon first side 16. Ferroelectric polymer (FEP) memory device 14 may be made of an FEP layer that is sandwiched between electrodes that achieve row and column layouts according to row-and-column addressing techniques.

Various polymers may be used to form the FEP layers. In one embodiment, the FEP layer is made from a ferroelectric polymer selected from polyvinyl and polyethylene fluorides, copolymers thereof, and combinations thereof In another embodiment, the FEP layer is made from a ferroelectric polymer selected from polyvinyl and polyethylene chlorides, copolymers thereof, and combinations thereof. In another embodiment, the FEP layer is made from a ferroelectric polymer selected from polyacrylonitriles, copolymers thereof, and combinations thereof. In another embodiment, the FEP layer is made from a ferroelectric polymer selected from polyamides, copolymers thereof, and combinations thereof. Other embodiments may include combinations of the above that cross different types such as polyfluorides and polyamides or polyfluorides and polyacrylonitriles.

In one embodiment, the FEP layer is made from a ferroelectric polymer selected from $(CH_2—CF_2)_n$, $(CHF—CF_2)_n$, $(CF_2—CF_2)_n$, $\alpha$-, $\beta$-,$\gamma$-, and $\delta$-phases thereof, preferably the $\beta$-phase, $(CH_2—CF_2)_n—(CHF—CF_2)_m$ copolymer, $\alpha$-, $\beta$-, $\gamma$-, and $\delta$-phases, preferably the $\beta$-phase of $(CH_2—CF_2)$ copolymer, and combinations thereof. The copolymer of $(CH_2—CF_2)_n—(CHF—CF_2)_m$ may be referred to as P(VDF-TrFE) or poly vinylidene fluoride-triflouroethylene. In one particular embodiment, the FEP layer is made from a ferroelectric polymer selected from a phase copolymer of $(CH_2—CF_2)_n—(CHF—CF_2)_m$ wherein n and m equal 1, and wherein n is in a fraction range from about 0.6 to about 0.9, preferably from about 0.7 to about 0.8, and more preferably about 0.75.

A preferred vertical thickness of an FEP layer may be in a range from about 500 Å to about 2,000 Å or larger, subject only to the design rules of a specific application. Other thicknesses for the FEP layer may be in a range from about 750 Å to about 1,500 Å. In one embodiment, the FEP layer may be about 1,000 Å.

Most polymer systems will exhibit some degree of atacticity. Where an FEP copolymer is deposited by a spin-on technique, the film will tend more away from isotacticity than for a monomer under similar deposition conditions. In one embodiment, the ordered amount of crystallinity (degree of isotacticity) in an FEP layer is in a range from about one-third to about two-thirds, preferably greater that about one-half. The ordered amount of the crystalline structure may be quantified by diagnostic techniques such as scanning electron microscopy, x-ray diffraction, and others. Greater isotacticity may be achievable by other deposition techniques such as Langmuir-Blodgett deposition as is known in the art.

Substrate 12 may be mounted on a lead frame 20 that may have J-type or gull wing-type termini or others. Lead frame 16 may be prepared according to known technique. Thereafter, substrate 12 may be place on lead frame 20 by known technique such as adhesive bonding. Subseqently, as for most memory technologies, the package 10 may be surface mounted upon a module board or upon a motherboard and the like.

According to the present invention, packaging of an FEP memory device has unique problems due to its sensitivity to both thermal and mechanical stresses. Accordingly, the present invention may provide a packaging core that may comprise an upper core 22 and a lower core 24. Upper core 22 may be mounted over FEP memory device 14 and substrate 12 with a recess geometry that resist contact with the polymer. As depicted in FIG. 1, a rectilinear-profile recess 26 is formed by upper core 22 over FEP memory device 14 that resists contact between the polymer of FEP memory device 14 and upper core 22. Bond wires 28 are provided for electrical interfacing between FEP memory device 14 and lead frame 20. Because of the preferred lower packaging temperatures, it is also preferable to use a lead-free solder that exhibits a reflow temperature at or below about 120° C. In one embodiment, bond wires 28 are made of aluminum. In another embodiment, bond wires 28 are made of copper. Other materials may be used depending upon a specific application.

Upper core 22 may be mounted upon lead frame 20 by known technique such as pre-molding of upper core 22 and pick-and place technology. Upper core 22 may be adhesively bonded to lead frame 20. Upper core 22 may be made of a thermoplastic material such as a bismalimide-triazine (BT) composition or the like. Lower core 24 may also be made of a BT composition or the like and it may also be adhesively bonded or otherwise disposed upon lead frame 20 directly below substrate 12. The BT core material may have a vertical thickness, T, in a range from about 0.5 mm to about 3 mm, preferably from about 1 mm to about 2 mm. However, the vertical thickness, T, may depend upon the specific application.

With upper core 22 and lower core 24 in place, an outer package may be formed according to an embodiment. The outer package may comprise an injection-molded compound as is known in the art. The outer package may comprise an upper section 30 and a lower section 32 as may be formed by injection molding technology.

Upper core 22 and lower core 24, if present, preferably have a thermoplastic flow temperature of about 150 C . Accordingly, the outer package may comprise a material with a thermoplastic flow temperature that is greater than the thermoplastic flow temperature of the packaging core. The material of the outer package may be encapsulation material as is known in the art. Although some intermingling of the outer package and the packaging core may occur during injection molding of the outer package (due to its higher thermoplastic flow temperature) the packaging core may resist melting that would otherwise compromise its recess geometry. In one embodiment, the core material has a lower thermal conductivity than the packaging material.

Figure 2:
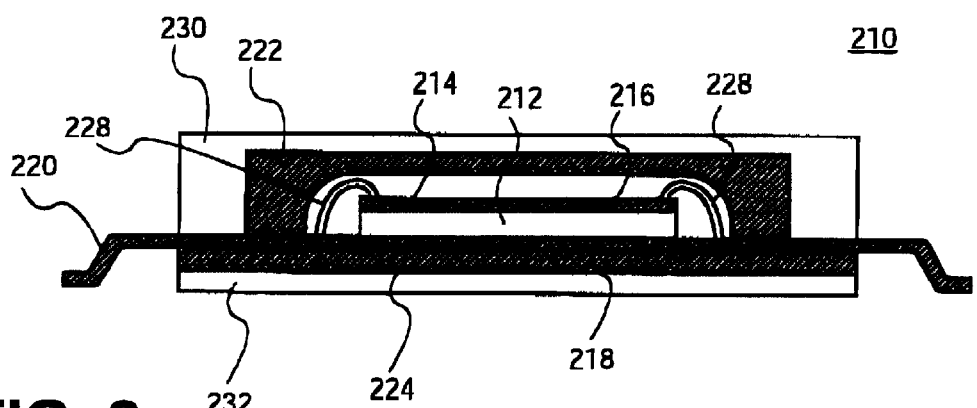
FIG. 2 is an elevational cross-section of a ferroelectric polymer memory device package according to a device-on-chip substrate embodiment.

It may also be preferable to use a packaging core material that has a recess geometry that is curvilinear as is illustrated in FIG. 2. As set forth herein, a package 210 may include a substrate 212 and an FEP memory device 214 mounted on a first side 216 of substrate 212. Similarly, a second side 218 is disposed against a lead frame 220. A packaging core is provided that includes an upper core 222 and a lower core 224. The packaging core forms a curvilinear profile recess 226 in which FEP memory device 214 resides. Accordingly, upper core 222 resists contact between the polymer of FEP memory device 214 and upper core 22. Upper core 222 may be contoured to accommodate bond wires 228. Accordingly, upper core 222 may carry a greater mechanical stress than upper core 22 of package 10 depicted in FIG. 1. Therefore, during injection molding of an outer package 230, 232 may be done under a greater pressure due to the curvilinear profile of upper core 222.

Figure 3:
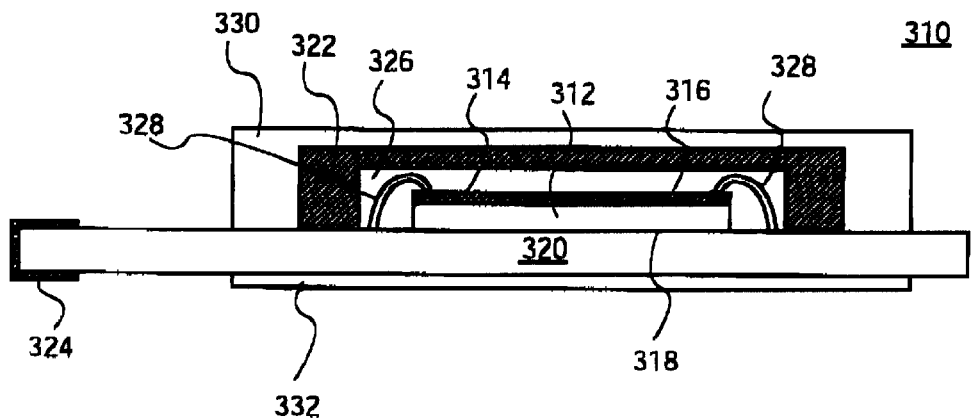
FIG. 3 is an elevational cross-section of a ferroelectric polymer memory device package according to a device-on-chip substrate embodiment.

Some inventive polymer memory packaging may be carried out where the FEP memory device is mounted on a board such as a memory module. FIG. 3 is an elevational cross-section of a ferroelectric polymer memory device package 310. A substrate 312, carries an FEP memory device 314 upon a first side 316 thereof. A second side 318 of substrate 312 is disposed over a board 320. Although some structures may appear similar to the packages depicted in FIGS. 1 and 2, because the substrate 312 is mounted directly on a board 320 such as a trace-bearing fiberglass-resin (FR) board, a lower core structure may be optional.

In this embodiment, the packaging core may consist essentially of an upper core 322. Upper core 322 may be disposed over board 320 as set forth herein. A first signal interface 324 may be a contact such as for a single-in-line memory module (SIMM), a dual-in-line memory module (DIMM), and the like or others. As depicted in FIG. 3, a rectilinear-profile recess 326 is formed from upper core 322 that resists contact between the polymer of FEP memory device 314 and upper core 322.

A second signal interface may include bond wires 328 that connect FEP memory device 314 to board 320. An outer package may comprise an injection-molded compound as is known in the art. The outer package may comprise an upper section 330 and a lower section 332 as may be formed by injection molding technology and as set forth herein.

Package 310 may carry a plurality of FEP memory devices 314 such that a multi-rank memory chipset may be formed. Optionally or additionally, the chipset may include other devices in addition to the FEP memory device such as a memory controller and the like.

Figure 4:
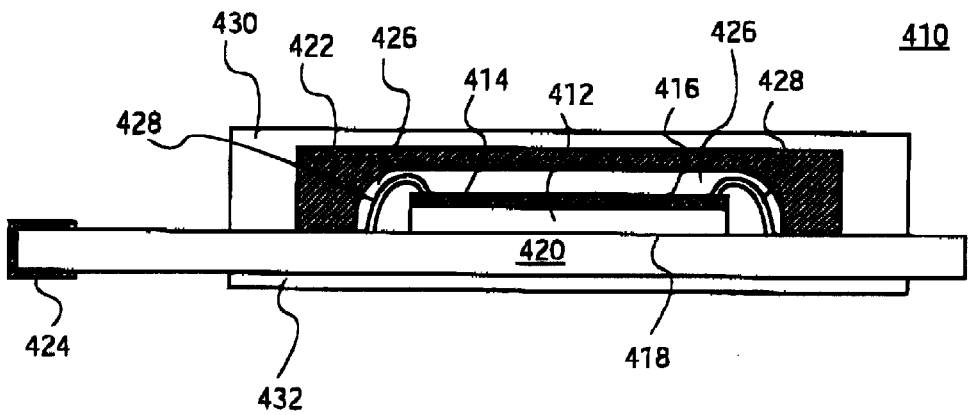
FIG. 4 is an elevational cross-section of a ferroelectric polymer memory device package according to a device-on-chip substrate embodiment.

FIG. 4 is an elevational cross-section of a ferroelectric polymer memory device package 410 according to a device-on-chip substrate embodiment. In comparison to package 310 depicted in FIG. 3, a curvilinear-profile recess is formed to protect an FEP memory device. A substrate 412, carries an FEP memory device 414 upon a first side 416 thereof. A second side 418 of substrate 412 is disposed over a board 420.

An upper core 422 may be disposed over board 420 as set forth herein. A first signal interface 424 may be a contact such as for a SIMM, a DIMM, and the like or others. Similar to the depiction in FIG. 2, a curvilinear-profile recess 426 is formed from upper core 422 that resists contact between the polymer of FEP memory device 414 and upper core 422.

A second signal interface may include bond wires 428 that connect FEP memory device 414 to board 420. An outer package may comprise an injection-molded compound as is known in the art. The outer package may comprise an upper section 430 and a lower section 432 as may be formed by injection molding technology and as set forth herein.

Figure 5:
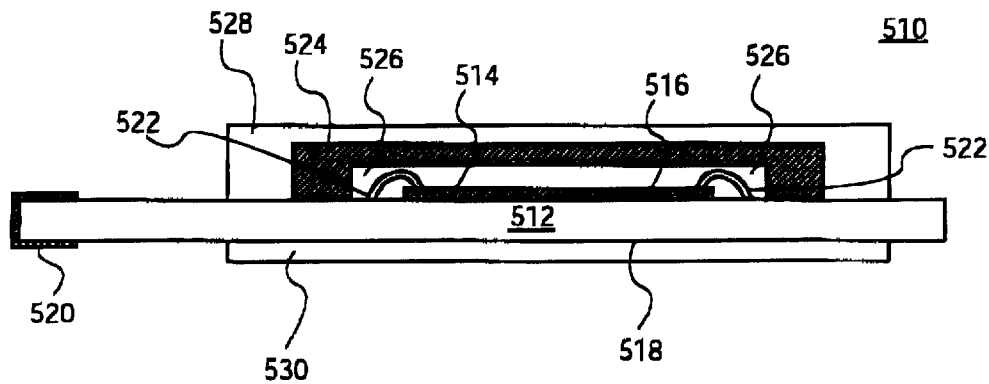
FIG. 5 is an elevational cross-section of a ferroelectric polymer memory device package according to device-on board substrate embodiment.

FIG. 5 is an elevational cross-section of an FEP memory device package 510 according to a device-on-board substrate embodiment. In some embodiments, it may be preferable to form an FEP memory device directly upon a substrate such as an FR board or the like as part of a chipset that may not require or use an inorganic substrate such as a silicon substrate. FEP layer processing temperatures may allow for these embodiments. Where such a process flow may be used, protection of the FEP memory device becomes paramount as it will likely prefer first fabrication of the FEP memory device upon the board before any other chips or the like are added to the FR board. Accordingly, an embodiment of the present invention includes a substrate 512 that is also a board. An FEP memory device 514 is disposed upon a first side 516 of substrate 512. In this embodiment, the second side 518 of substrate 512 is the backside of a board (substrate 512) such as an FR board. According to processing conditions that are compatible with substrate 512, the formation of row and column lines below and above and FEP layer may be carried out by physical vapor deposition (PVD) with the metal/metal oxide interfacial layer made by atomic layer chemical vapor deposition (ALCVD) or the like.

FIG. 5 also illustrates a first signal interface 520 that is in the form of contacts such as for a DIMM or SIMM package. A second signal interface is also provided in the form of bond wires 522 that makes electrical contact between FEP memory device 514 and substrate 512, Because of the sensitive physical nature of the FEP memory device 514, the second signal interface, instead of bond wires 522, may be peripherally extended pafteming of the row and column lines (not pictured) of FEP memory device 514. Accordingly, metal deposition of row and column lines may be carried out to make electrical contact with traces disposed on or in substrate 512.

Packaging of FEP memory device 514 may be carried out as set forth herein, An upper core 524 may be made of BT material or the like and may be disposed over FEP memory device 514 as set forth herein. Where upper core 524 has a rectilinear recess profile, a rectilinear-profile recess 526 is formed from upper core 524 that resists contact between the polymer of FEP memory device 514 and upper core 524, In this embodiment, it may be noted that the overall profile of package 510 may be lower than a package with a silicon substrate that carries an FEP memory device. In any event, according to embodiments set forth herein, thin small out-line package (TSOP) technology may be employed. Additionally, thin shrink small outline package (TSSOP) technology may be employed herein. In such an embodiment, the outer package 528, 530 may shrink over upper core 524.

Figure 6:
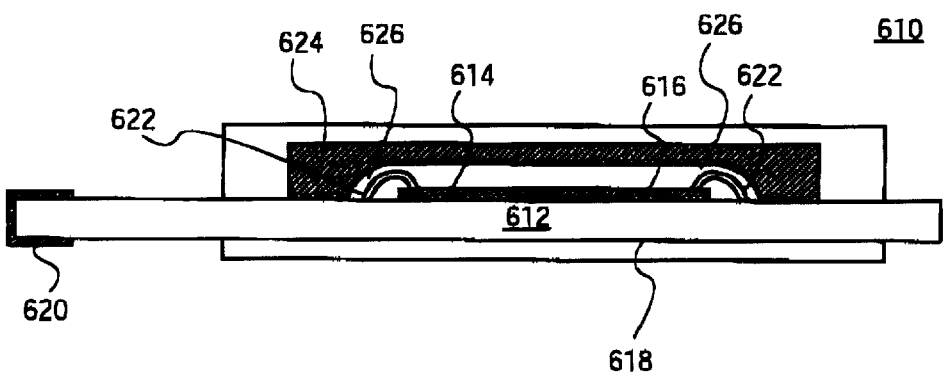
FIG. 6 is an elevational cross-section of a ferroelectric polymer memory device package according to device-on board substrate embodiment.

FIG. 6 is an elevational cross-section of a ferroelectric polymer memory device package 610 according to another device-on board substrate embodiment. In this embodiment, all structures may be substantially similar to those depicted in FIG. 5 with the exception that a curvilinear-profile recess 626 is formed.

Figure 7:
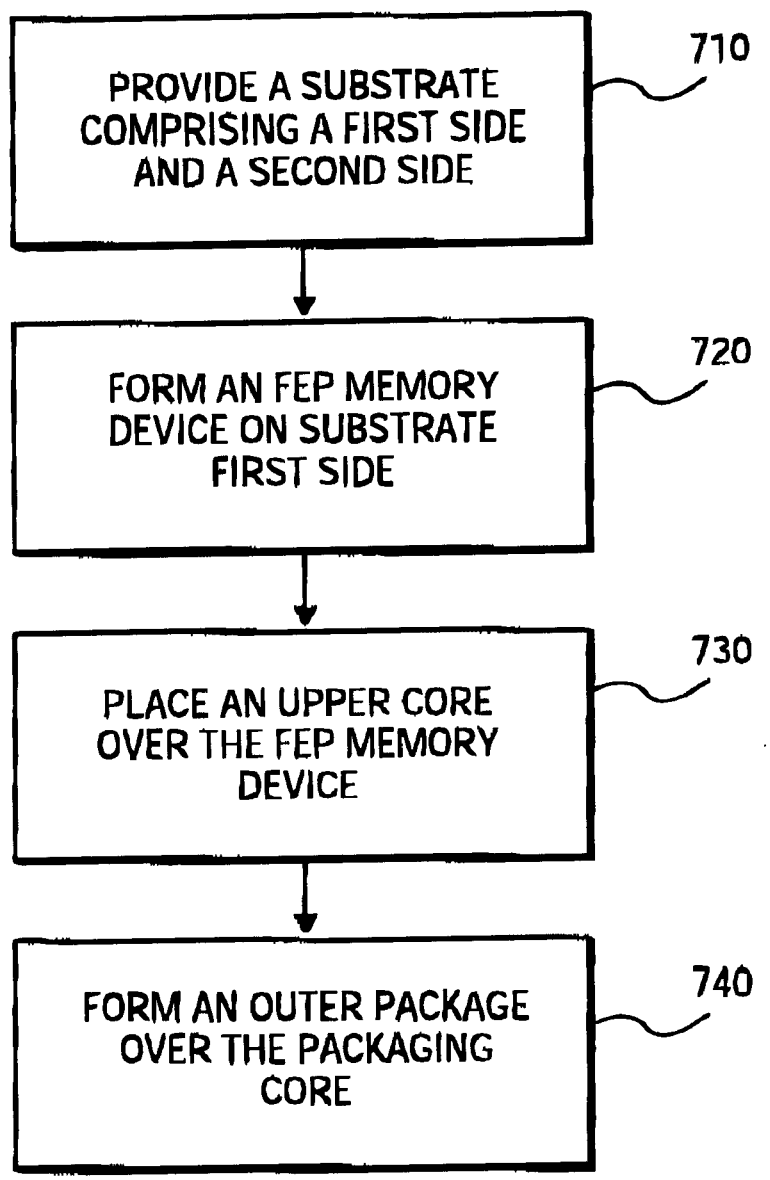
FIG. 7 is a flow chart that describes an inventive method according to the present invention.

FIG. 7 is a process flow diagram according to an embodiment. A process 700 includes providing 710 a substrate comprising a first side and a second side. The process 700 continues by forming 720 a ferroelectric polymer memory device on the first side. Next, the process flow continues by placing 730 an upper core over the ferroelectric polymer memory device by placing it over the first side of the substrate. The process flow may complete itself by forming 740 an outer package over the packaging core. According to the embodiment, the outer package does not cause the packaging core to come into contact with the ferroelectric polymer memory device. Further, the packaging core resists transient heating such that both injection molding to form the outer package, and surface mounting to form a mounted FEP memory package are sufficiently restricted in their heating effects to prevent low yield processing. A low-temperature process for forming an FEP memory device package according to an embodiment, is carried out in the temperature range from about 130 C to about 150 C. Accordingly, the effects of higher-temperature packaging that may conventionally be at about 175 C are avoided.

According to an embodiment, a memory system comprises a host (not pictured) and at least one of the FEP memory packages as set forth herein. The package is inserted into a host (not pictured) according to an embodiment of the present invention. The memory system may include an FEP memory device disposed upon a substrate as set forth herein.

A physical interface as depicted in FIGS. 1–6 for a host may include outer structure 30, 32 as illustrated in FIG. 1 by way of non-limiting example. In one embodiment, the physical interface may be a dual in-line lead frame package that will disposed upon a motherboard, an expansion card, and application-specific integrated circuit (ASIC) board, or the like. The signal interface may be inner bond wires as set forth herein, and outer lead frame pins as set forth herein. Other embodiments of a signal interface may include optical interfaces including waveguides guides and spatial transmitter/receiver devices.

Various physical interfaces may be employed with the inventive memory system, depending upon the appropriate host portion of the system. The memory system may be employed with a physical interface that is configured to a host type selected from a PCMCIA card interface, a personal data assistant (PDA) interface with or without wireless communication ability, and a hand-held host such as a cellular telephone. Another host type may be a mobile data storage interface that may include a compact flash card interface, a MEMORY STICK® interface made by Sony Corporation, a HIP ZIP® interface made by Iomega Corporation, a POCKET CONCERT® interface made by Intel Corporation, and others. Another host type may be a removable storage medium interface, a desktop personal computer expansion slot interface, and the like. In each instance, the appearance of the specific physical interface will vary to take on the requisite receptacle, etc. of the host. Similarly, the appearance of the specific signal interface will vary to take on the requisite connector, etc. of the host.

For example, a PCMCIA card has a physical interface comprising at least the long edges of the card that frictionally and slidingly connect with the card bay. The signal interface for a PCMCIA card comprises at least the female multi-contact sockets at the back of the card, and the specific plug-in outlets at the front of the card.

Low operating voltages are preferred and achieved by embodiments of the present invention. According to an embodiment, switching voltage may be in the range from about 0.5 V to less than about 9 V, and preferably in a range from about 0.5 V to about 5 V. This voltage may relate to both the destructive read method and the write method according to an embodiment. Nonvolatile memory such as flash may require charge pump technology to achieve a sufficient voltage to write to the floating gate. The present invention presents a low-voltage technology for nonvolatile memory that may obviate the need for charge pump technology and other higher-voltage memory technologies.

The following is an example of a method of making an embodiment of the present invention. Reference may be made to FIG. 1. First, a lead frame 20 is provided and a substrate 12 is provided, comprising logic-bearing silicon for an inventive cross-point ferroelectric polymer memory device. The substrate 12 may include a dielectric material such as silicon oxide. Over substrate 12 a first or lower series of electrodes is formed by physical vapor deposition (PVD of a material such as aluminum or copper or another electrical conductor. Thereafter, an FEP layer is spun on under conditions of depositing the FEP material as a fluid in a puddle prime over substrate 12 for a period of from about 5 to 25 seconds and spinning substrate 12 in a rotational range from about 300 rpm to about 6000 rpm and for a time range from about 5 seconds to about 20 seconds. Over the FEP layer, a second or upper series of electrodes is formed by PVD of the electrode and with ALCVD of the metal/metal oxide interfacial layer. The second electrodes may be configured in a cross-point layout to the first electrodes. The second electrodes may be aluminum or copper or another electrical conductor.

The lateral width of the electrodes may be tied to photolithography process flows. For example, the electrodes may have minimum features that are 0.25 micrometers (microns), 0.18 microns, 0.13 microns, and 0.11 microns. Thereafter, the combination of first electrodes, the FEP layer, and the second electrodes comprise what is herein referred to as FEP memory device 14.

If any of the FEP layer needs to be removed, FEP memory device 14, or the FEP layer if the second electrodes are not in place, may be center masked and an oxygen plasma etch may be carried out at ambient temperature that may be about 23 C and pressure.

After formation of FEP memory device 14, substrate 12 is pick-and-place disposed upon lead frame 20 and an adhesive layer (not pictured) is used according to die-attach techniques known in the art. Thereafter, aluminum wire bonds 28 are formed from various pin-out precursors (not pictured) in FEP memory device and lead frame 20. A lead-free solder is used that has a reflow temperature below about 120° C.

An upper core 22 made of a BT composition or the like is placed over FEP memory device 14 and substrate 12 and adhered to substrate 12 by an adhesive layer (not pictured). A lower core 24 is likewise placed below lead frame 20 under similar conditions. The disposition of upper core 22 and lower core 24 may be carried out by a process flow such as tape-automated bonding (TAB) that is sensitive to alignment requirements according to a specific application.

The package precursor comprising the packaging core as the outer exposure, is placed in an injection-molding die and compression molding compound is charged into the die at a temperature of about 150° C.

After sort and test processes, the FEP memory package 10 is pick-and-place affixed upon a host or board and surface mounted with a lead-free solder. According to this example, the cross-point matrix polymer memory structure operates in a range below about 9 V, and preferably in a range from about 0.5 V to about 5 V. This voltage may relate to both the destructive read method and the write method according to an embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A polymer memory package comprising:
   a substrate comprising a first side and a second side;
   a ferroelectric polymer memory device disposed on the substrate first side; and
   a packaging core disposed over the substrate, wherein the packaging core comprises a recess geometry that is spaced apart from the ferroelectric polymer memory device.

2. The polymer memory package according to claim 1, wherein the packaging core comprises a bismalimide-triazine composition.

3. The polymer memory package according to claim 1, wherein the packaging core further comprises:
   an upper core disposed over the substrate; and
   a lower core disposed under the substrate.

4. The polymer memory package according to claim 1, the packaging core further comprising:
   an upper core selected from a rectilinear-profile recess and a curvilinear-profile recess, wherein the upper core is disposed over the first side.

5. The polymer memory package according to claim 1, further comprising:
an outer package disposed over the packaging core.

6. The polymer memory package according to claim 1, further comprising:
an outer package disposed over the packaging core, wherein the packaging core comprises a material with a thermoplastic flow temperature of about 150 C, and wherein the outer package comprises a material with a thermoplastic flow temperature that is greater than the thermoplastic flow temperature of the packaging core.

7. The polymer memory package according to claim 1, further comprising:
an outer package disposed over the packaging core, wherein the packaging core comprises a bismalimide-triazine material with a first thermoplastic flow temperature, and wherein the outer package comprises a material with a thermoplastic flow temperature that is greater than the thermoplastic flow temperature of the packaging core.

8. The polymer memory package according to claim 1, the polymer memory device further comprising:
a lead frame support structure disposed below and on the substrate; and
at least one electrical connection between the polymer memory device and the lead frame support structure.

9. The polymer memory package according to claim 1, the polymer memory device further comprising:
a fiberglass-resin board support structure disposed below the ferroelectric polymer device; and
at least one electrical connection between the ferroelectric polymer memory device and the fiberglass-resin board support structure.

10. The polymer memory package according to claim 1 further comprising:
encapsulation material disposed over the first side and over the packaging core.

11. The polymer memory package according to claim 10 further comprising:
encapsulation material disposed upon the first side and over the packaging core.

12. A polymer memory package comprising:
a lead frame comprising a first side and a second side;
a ferroelectric polymer memory device disposed over the lead frame first side;
a plurality of wire bonds that connect the polymer memory device to the lead frame;
a lower core structure disposed upon the second side; and
an upper core structure disposed upon the first side, wherein the upper core structure forms a recess geometry that is spaced apart from the ferroelectric polymer memory device.

13. The polymer memory package according to claim 12, wherein the upper core structure comprises a bismalimide-triazine composition.

14. The polymer memory package according to claim 12 further comprising:
encapsulation material disposed over the first side and the second side, and over the upper core.

15. The polymer memory package according to claim 12, wherein the plurality of wire bonds comprise aluminum wires.

16. The polymer memory package according to claim 12, wherein the plurality of wire bonds is connected with lead-free solder that exhibits a reflow temperature below about 120° C.

17. The polymer memory package according to claim 12, wherein the recess geometry is selected from rectilinear and curvilinear.

18. The polymer memory package according to claim 12, wherein the lead frame comprises a copper material.

19. A process of packaging a polymer-memory device comprising:
providing a substrate comprising a first side and a second side;
forming a ferroelectric polymer memory device on the first side; and
placing an upper core over the first side, wherein the upper core comprises a recess geometry that is spaced apart from the ferroelectric polymer memory device.

20. The process according to claim 19, further comprising:
placing a lower core under the second side.

21. The process according to claim 19, further comprising:
providing a support structure comprising a lead frame; and
placing the second side on the support structure.

22. The process according to claim 19, further comprising:
providing a support structure comprising a lead frame;
placing, the second side on the support structure; and
forming an electrical connection between the ferroelectric polymer memory device and the lead frame.

23. The process according to claim 19, further comprising:
providing a support structure comprising a chipset board; and
placing the second side on the support structure.

24. The process according to claim 19, further comprising:
providing a support structure comprising a chipset board;
placing the second side on the support structure; and
forming an electrical connection between the ferroelectric polymer memory device and the chipset board.

25. A memory system comprising:
a host comprising a host interface;
a physical interface disposed at the host interface;
a substrate disposed on the physical interface, the substrate comprising a first side and a second side;
a ferroelectric polymer memory device disposed on the first side;
a packaging core disposed on the physical interface, wherein the packaging core forms a recess geometry that resists contact with the polymer; and
a signal interface for communication from the ferroelectric polymer memory device to the host.

26. The memory system according to claim 25, wherein the host interface is selected from a PCMCIA card interface, a compact flash card interface, a memory stick-type card interface, a desktop personal computer expansion slot interface, and a removable medium interface.

27. The memory system according to claim 25, wherein the substrate is selected from an inorganic, logic-bearing device and an organic, trace-bearing device.

* * * * *

UNITED STATES PATENT AND TRADEMARK OFFICE
CERTIFICATE OF CORRECTION

PATENT NO.    : 6,524,887 B2
DATED         : February 25, 2003
INVENTOR(S)   : Li et al.

It is certified that error appears in the above-identified patent and that said Letters Patent is hereby corrected as shown below:

Column 3,
Line 22, delete "$(CH_2\text{---}CF_2)$", insert -- $(CH_2\text{-}CF_2)_n\text{ -}(CH_2\text{-}CF_2)_m$ --.

Column 6,
Line 8, delete "pafteming", insert -- patterning --.

Column 7,
Line 6, after "waveguides", delete "guides".

Signed and Sealed this

Twelfth Day of August, 2003

JAMES E. ROGAN
*Director of the United States Patent and Trademark Office*